United States Patent
Tomita

(10) Patent No.: US 8,518,810 B2
(45) Date of Patent: Aug. 27, 2013

(54) METHOD FOR MANUFACTURING A SEMICONDUCTOR DEVICE

(75) Inventor: Ken Tomita, Iwate-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 13/225,790

(22) Filed: Sep. 6, 2011

(65) Prior Publication Data

US 2012/0070970 A1     Mar. 22, 2012

(30) Foreign Application Priority Data

Sep. 17, 2010   (JP) .................................. 2010-209363

(51) Int. Cl.
    *H01L 21/266*     (2006.01)
(52) U.S. Cl.
    USPC .................... 438/533; 257/E21.346
(58) Field of Classification Search
    None
    See application file for complete search history.

(56) References Cited

U.S. PATENT DOCUMENTS

| 6,753,948 B2* | 6/2004 | Taniguchi ...................... 355/71 |
| 6,798,509 B2* | 9/2004 | Sonehara et al. ............. 356/344 |
| 8,307,310 B2* | 11/2012 | Kotani et al. .................. 716/51 |
| 2001/0011981 A1* | 8/2001 | Yamamoto et al. ............. 345/87 |

FOREIGN PATENT DOCUMENTS

JP   2009-170653   7/2009

* cited by examiner

*Primary Examiner* — Seahvosh Nikmanesh
(74) *Attorney, Agent, or Firm* — Oblon, Spivak, McClelland, Maier & Neustadt, L.L.P.

(57) ABSTRACT

A method for manufacturing a semiconductor device includes; exposing a resist layer 16 uniformly formed on a semiconductor substrate 11 using a grating mask 17 having transmission regions 17A whose transmittances decrease toward a transfer direction of charges, forming a plurality of residual resist films 18 whose film thicknesses change according to the transmittances of the grating mask 17 by developing the exposed resist layer 16, and forming a plurality of impurity layers 13 having an inner potential including a predetermined reference potential Pb and a predetermined step potential Ps by implanting ions 20 into the semiconductor substrate 11 through the residual resist films 18, wherein an acceleration voltage and a dose amount of the ion implantation device 19 are determined so that an error of the inner potential caused by an error of the film thickness of the residual resist film 18 stays within a permissible range.

16 Claims, 6 Drawing Sheets

METHOD FOR MANUFACTURING A SEMICONDUCTOR DEVICE

CROSS REFERENCE TO RELATED APPLICATIONS

This application is based upon and claims the benefit of priority from the prior Japanese Patent Application No. 2010-209363 filed in Japan on Sep. 17, 2010; the entire contents of which are incorporated herein by reference.

FIELD

Embodiments described herein relate generally to a method for manufacturing a semiconductor device.

BACKGROUND

A semiconductor device, such as a solid-state image pickup device has been known, in which transfer registers are formed as a plurality of impurity layers extending in lines in such a manner that the impurity layers become deeper toward a transfer direction of charges. In this configuration, charges can be transferred efficiently, as well as the charges can be prevented from being transferred in a backward direction.

It is known that these impurity layers can be formed using a grating mask in which light transmittance is different depending on positions. More specifically, a resist layer on a semiconductor substrate is exposed using the grating mask in which light transmittance is controlled so that the light transmittance gradually increases toward a transfer direction of charges. Subsequently, the exposed resist layers are developed. Then, residual resist films that have portions in which the film thickness gradually decreases toward the transfer direction of charges are formed. When ions are implanted into the semiconductor substrate using the residual resist films as a mask, impurity layers are formed in which the layers gradually become deeper toward the transfer direction of charges in accordance with the film thicknesses of the residual resist films.

However, this conventional manufacturing method of the solid-state image pickup device has a problem in that the film thicknesses of the residual resist films greatly deviate from a desired film thickness. When the film thickness deviates from a desired film thickness, the depths of the impurity layers formed deviate from desired depths depending on the film thickness. Therefore, it is impossible to stably form impurity layers having a desired inner potential.

Specifically, since a potential difference between inner potentials of adjacent impurity layers (step potential) changes, it impossible to stably obtain an effect of accumulating charges and preventing backward flow of the accumulated charges. Accordingly, the efficiency of charge transfer is deteriorated, and a solid-state image pickup device satisfying product characteristics cannot be formed.

Embodiments of the present invention are described in view of resolving the above problem, and it is an object to provide a method for manufacturing a semiconductor device capable of satisfying desired product characteristics even if the film thicknesses of residual resist films vary.

DETAILED DESCRIPTION

A method for manufacturing a semiconductor device according to an embodiment of the present invention includes the steps of forming a resist layer having a uniform film thickness on a semiconductor substrate, exposing the resist layer using an exposure mask having a plurality of transmission regions whose transmittances change toward a transfer direction of charges, developing the exposed resist layer and thereby forming a plurality of residual resist films whose film thicknesses change according to the transmittances of the exposure mask, and forming, within the semiconductor substrate, a plurality of impurity layers forming an inner potential having a predetermined reference potential and a predetermined step potential by implanting ions using an ion implantation device into the semiconductor substrate through the residual resist films, wherein an acceleration voltage and a dose amount of the ion implantation device are determined so that an error of the inner potential caused by an error of the film thicknesses of the residual resist films stays within a permissible range.

Hereinafter, the method for manufacturing a semiconductor device according to an embodiment of the present invention will be described in detail with reference to the drawings. In this explanation about the manufacturing method, a method for manufacturing a solid-state image pickup device will be explained as an example.

A solid-state image pickup device produced by the method for manufacturing of the solid-state image pickup device according to the present embodiment includes a plurality of pixel unit each composed of a photodiode is arranged in a matrix form, a charge accumulation unit connected to the pixel unit for accumulating the charges generated by the pixel unit, and a CCD (Charge Coupled Device) transfer register for transferring the charges accumulated in the accumulation unit to an output unit. In particular, the CCD transfer register includes vertical transfer registers each connected to the charge accumulation unit and a horizontal transfer register connected to the vertical transfer registers.

Figure 1:
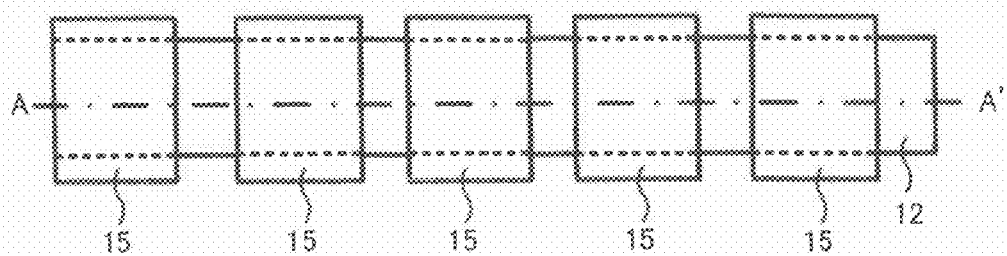
FIG. 1 is a top view illustrating an essential portion of a horizontal transfer register formed by a manufacturing method of a solid-state image pickup device according to the present embodiment.
Figure 2:
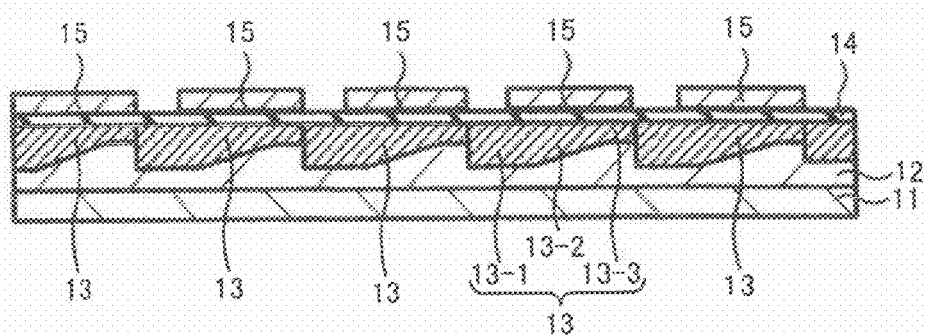
FIG. 2 is a cross sectional view illustrating an essential portion of the horizontal transfer register taken along an alternate long and short dashed line A-A' of FIG. 1.

FIG. 1 is a top view illustrating an essential portion of the horizontal transfer register. FIG. 2 is a cross sectional view illustrating an essential portion of the horizontal transfer register taken along an alternate long and short dashed line A-A' of FIG. 1. As shown in FIG. 2, in the horizontal transfer register, a P-type well layer 12 in a belt shape is formed on a surface of an N-type semiconductor substrate 11 made of, e.g., silicon. On the surface of the well layer 12, a plurality of N+ type impurity layers 13 are arranged and formed in rows in a longitudinal direction of the well layer 12.

In each impurity layer 13 arranged in the well layer 12, a first to a third impurity region 13-1, 13-2 and 13-3 are arranged in this order along a direction opposite to a transmission direction of charges. The first impurity region 13-1 has a constant depth at the deepest portion. The third impurity region 13-3 has a constant depth at the shallowest portion, which is further explained later. The second impurity region 13-2 has a depth gradually decreasing from the deepest portion to the shallowest portion. The third impurity region 13-3 having a shallowest depth in each impurity layer 13 joins with the first impurity region 13-1 having a deepest portion of the adjacent impurity layer 13 at a surface of the well layer 12.

Over the impurity layers 13, a plurality of transfer electrodes 15 made of, e.g., polysilicon, are arranged with an oxide film 14 interposed between the transfer electrodes 15 and the impurity region. Each of the transfer electrodes 15 is located over a part of the first impurity region 13-1, the second impurity region 13-2, and the third impurity region 13-3. The oxide film 14 is made of, e.g., silicon oxide, uniformly formed on the semiconductor substrate 11. As shown in FIG. 1, for example, each of this plurality of transfer electrodes 15 has the same width, which is arranged in parallel and spaced from each other, so as to cross the well layer 12.

In such horizontal transfer register, clock pulses of positive and negative voltages are alternately applied to every other transfer electrodes 15, which control a potential formed in each impurity layer 13, thereby transferring the charges.

Subsequently, a method for manufacturing a horizontal transfer register shown in FIG. 2 will be explained with reference to FIGS. 3 to 7.

Figure 3:
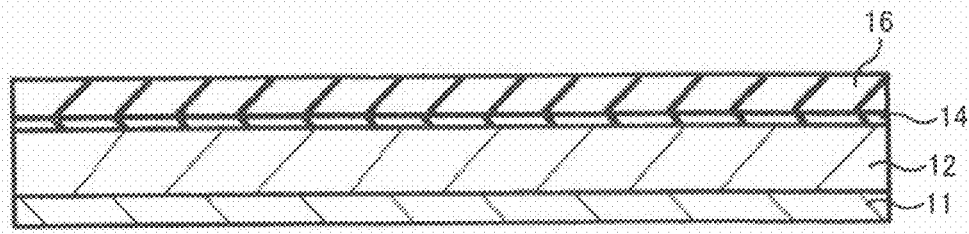
FIG. 3 is a cross sectional view, corresponding to FIG. 2, for explaining the manufacturing method of the solid-state image pickup device according to the present embodiment and showing a step of forming a resist layer.

First, as shown in FIG. 3, the oxide film 14 is formed on the semiconductor substrate 11 on which the well layer 12 is formed, and subsequently, the resist layer 16 is uniformly formed on the oxide film 14. It should be noted that the resist layer 16 is, for example, novolac series resist material whose composition is C:H:O=20:14:3, and the density is 1.3 g/cm$^3$.

Figure 4:
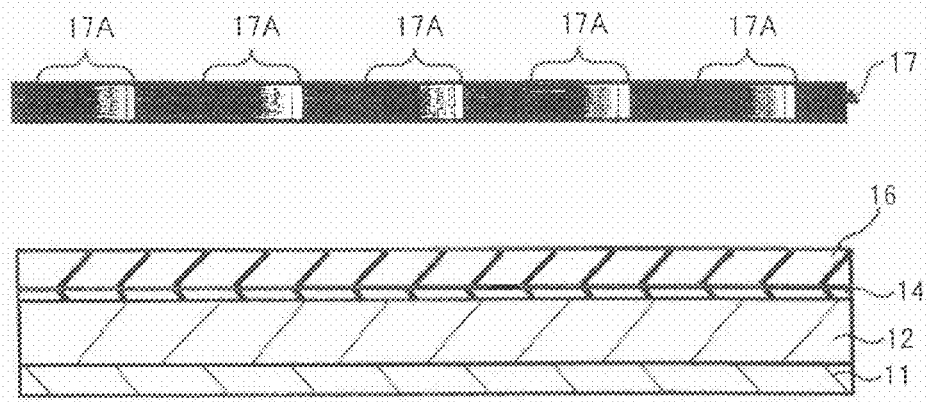
FIG. 4 is a cross sectional view of the solid-state image pickup device, corresponding to FIG. 2, for explaining a step of exposing the resist layer according to the manufacturing method of the present embodiment.
Figure 5:
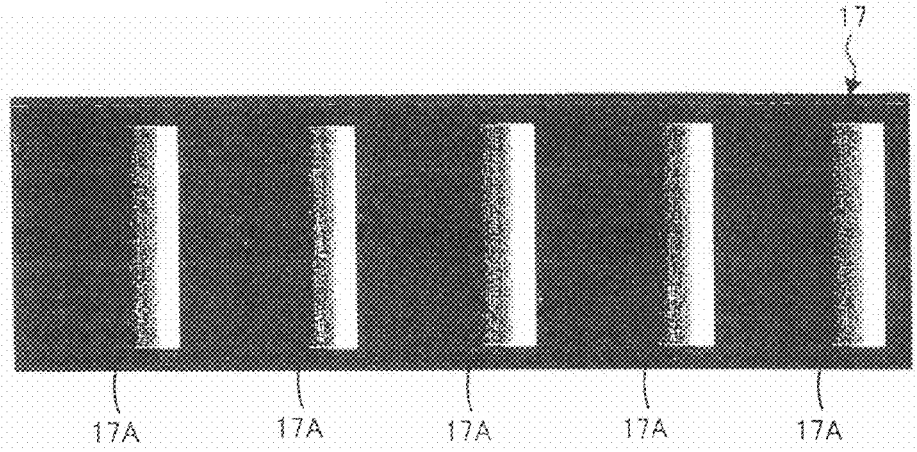
FIG. 5 is a top view illustrating a grating mask applied in the step shown in FIG. 4.

Subsequently, as shown in FIG. 4, the resist layer 16 is exposed using a grating mask 17. The grating mask 17 has a plurality of transmission regions 17A arranged in rows spaced apart from each other. The transmission region 17A is a region in which the light transmittance continuously decreases toward the transfer direction of charges. FIG. 5 shows a top view of the grating mask 17.

As shown in FIG. 5, the grating mask 17 applied in this step can control the amount of light transmission by arranging a light intercepting film in a form of a plurality of dots made of chromium film and the like on a surface of a substrate having light transmitting property such as glass plate. In other words, light intercepting films having a larger dot size may be arranged in regions where light transmittance is desirably reduced. Thus, the mask 17 applied in this step is obtained including the transmission region 17A in which the light transmittance gradually decreases toward the transfer direction of charges.

Alternatively, the transmission region 17A may be realized by adjusting density of light intercepting films having the same dot size in a unit area of the grating mask. In this case, the arrangement density is increased in regions where light transmittance is desirably reduced.

Now, referring to FIG. 4 again, when the resist layer 16 is exposed to exposure light through the grating mask 17 shown in FIG. 5, the amount of the exposure light corresponding to the transmittance of the transmission region 17A is irradiated onto the resist layer 16, so that the resist layer 16 hardens more in a portion where the amount of exposure light is high.

Figure 6:
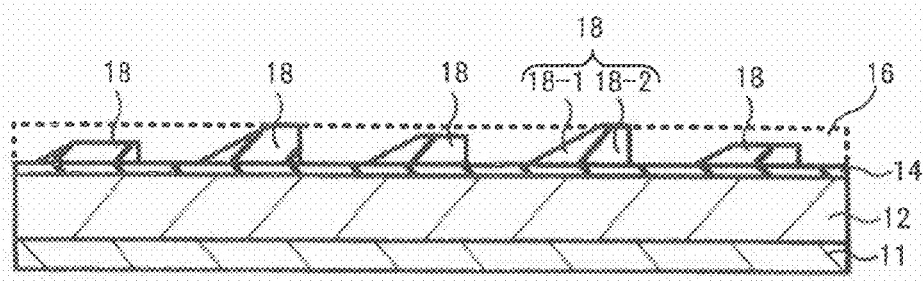
FIG. 6 is a cross sectional view of the solid-state image pickup device, corresponding to FIG. 2, for explaining a step of forming residual resist films according to the manufacturing method of the present embodiment.

Subsequently, as shown in FIG. 6, the exposed resist layer 16 is developed. Therefore, the resist layer 16 that is not hardened in the exposure step is dissolved, whereby a plurality of residual resist films 18 having film thicknesses in accordance with the transmittances of the transmission regions 17A of the grating mask 17 are formed, which are arranged in a row spaced from each other.

Each residual resist film 18 formed in this step includes a first resist region 18-1 and a second resist region 18-2. The film thickness of the first resist region 18-1 is continuously decreased toward the transfer direction of charges. The second resist region 18-2 is integrally formed with the portion of the first resist region 18-1 having a thickest portion and the second resist region 18-2 has a constant thickness corresponding to the thickest portion. Among the first resist region 18-1 and the second resist region 18-2, particularly, the film thickness of the second resist region 18-2 can satisfy product characteristics of the solid-state image pickup device. The method for determining the film thickness will be explained later in detail.

The reason why the pluralities of residual resist films 18 are formed spaced apart from each other, i.e., the reason why a resist film having a desired film thickness is not arranged between the pluralities of residual resist films 18, is explained as follows.

When such a long belt shape region as the horizontal transfer register, for example, is exposed, the same grating mask 17 is used multiple times to expose (shot) the region while the position of the mask 17 is moved. In other words, a so-called step exposure is employed. In this step exposure, each shot is performed after the position of the grating mask 17 is aligned, but the positioning process inevitably involves a position error. If a resist film having a desired film thickness is provided between the pluralities of residual resist films 18, the resist layer 16 corresponding to the position between the pluralities of residual resist films 18 is exposed twice due to the error of the position of the grating mask 17. As a result, a resist film having a film thickness that is greatly different from the desired film thickness is formed between the pluralities of residual resist films 18. Therefore, the first impurity region 13-1, explained later, that is formed by ions implanted through the resist film has a depth greatly different from a desired depth, which causes an inner potential, i.e., a reference potential Pb, to be greatly different from the desired value.

In contrast, when the resist film having the desired film thickness is not provided between the pluralities of residual resist films 18, the first impurity region 13-1 that is formed by ions implanted through a portion between the pluralities of residual resist films 18 can be formed with a stable depth regardless of the above problem. Therefore, this prevents the reference potential Pb from varying.

However, in the step for forming a plurality of residual resist films 18, the thickness of each residual resist film 18 involves an error as shown in FIG. 6, due to variation of the amount of exposure light emitted by the exposure device, for example. Therefore, the film thicknesses of the pluralities of residual resist films 18 vary from film to film. FIG. 6 shows that the film thicknesses of the pluralities of residual resist films 18 greatly vary within the same shot in the step exposure. The variation of the film thickness of the residual resist film 18 occurs in the same manner in each of the pluralities of residual resist films 18 formed in each different shot. Further, the variation occurs in the same manner in the pluralities of residual resist films 18 formed on different wafers.

Figure 7:
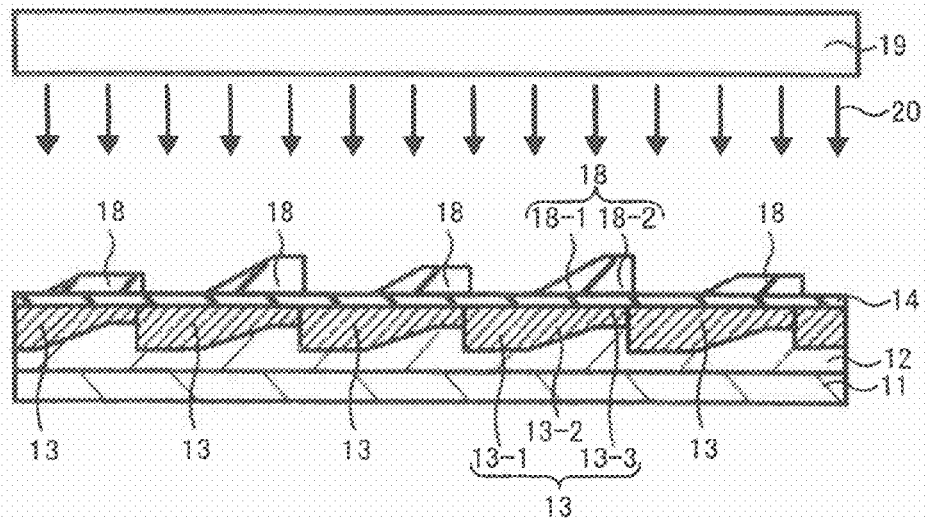
FIG. 7 is a cross sectional view of the solid-state image pickup device, corresponding to FIG. 2, for explaining a step of forming impurity layers according to the manufacturing method of the present embodiment.

Subsequently, an ion implantation device 19 implants N-type ions 20 such as phosphorous (P) into the well layer 12 using the pluralities of residual resist films 18 as a mask, as shown in FIG. 7. The depths of the implanted ions 20 depend on the film thicknesses of the residual resist films 18 due to collision cross section and film thickness dependence. Accordingly, the impurity layers 13 are formed to have depths corresponding to the film thicknesses of the residual resist films 18.

At this occasion, the acceleration voltage and the dose amount of the ion implantation device 19 are set such that the variation of the inner potentials formed by the impurity layers 13 stays within a permissible range for the product. The method for deciding the acceleration voltage and the dose amount will be explained later in detail.

Finally, the residual resist films 18 are removed, and the transfer electrodes 15 are formed at predetermined positions on each impurity layer 13 by patterning process, for example. Therefore, the horizontal transfer register as shown in FIG. 2 is formed.

Now, the method for deciding the acceleration voltage and the dose amount of the ion implantation device 19 and the method for deciding the film thickness of the second resist region 18-2 will be explained. In the explanation below, the film thickness of the second resist region 18-2 will be referred to as the film thickness of the residual resist film 18.

Figure 8:
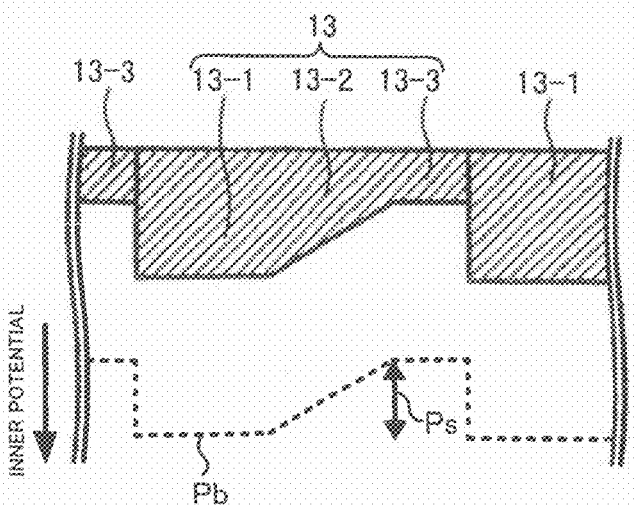
FIG. 8 is an explanatory diagram for explaining a reference potential and a step potential.

The acceleration voltage and the dose amount of the ion implantation device 19 as well as the film thickness of the second resist region 18-2 are determined to satisfy the product characteristics of the solid-state image pickup device. FIG. 8 is a diagram for explaining the product characteristics of the solid-state image pickup device. In the figure, a dotted line described in the lower part of the impurity layers 13 indicates the inner potential formed by the impurity layers 13. In the figure, the lower the dotted line goes, the higher the inner potential is.

As shown in FIG. 8, the product characteristics include a reference potential Pb and a step potential Ps. The reference potential Pb is the inner potential formed by the deepest portion of the second impurity region 13-2. The step potential Ps is a difference between the reference potential Pb and the inner potential at the shallowest portion of the second impurity region 13-2. However, as described above, the variation of the film thicknesses of the pluralities of residual resist films 18 is inevitable in the production. Therefore, the step potential Ps also varies according to this variation, but for this variation, a permissible range is defined for each product. This range is referred to as a permissible margin of the step potential Ps.

The reference potential Pb is given by charge transfer capacity required by the product. When the charge transfer capacity is desired to be raised, the reference potential Pb may be set at a high level.

On the other hand, the step potential Ps is given by the transfer efficiency that is required by the product. The transfer efficiency can be increased by increasing the step potential Ps.

Hereinafter, the method for deciding the film thickness of the residual resist film 18 as well as the acceleration voltage and the dose amount required for forming the solid-state image pickup device having reference potential Pb of 4.1 V and step potential Ps of 1.5 V will be described. It is assumed that the permissible margin of the step potential Ps for this device is ±0.3 V.

Subsequently, the acceleration voltage and the dose amount of the ion implantation device 19 are determined to satisfy the product characteristics on the basis of the relationship between the film thickness of the residual resist film 18 and the inner potential of the impurity layer 13 formed by ion implantation via the residual resist films 18.

Figure 9:
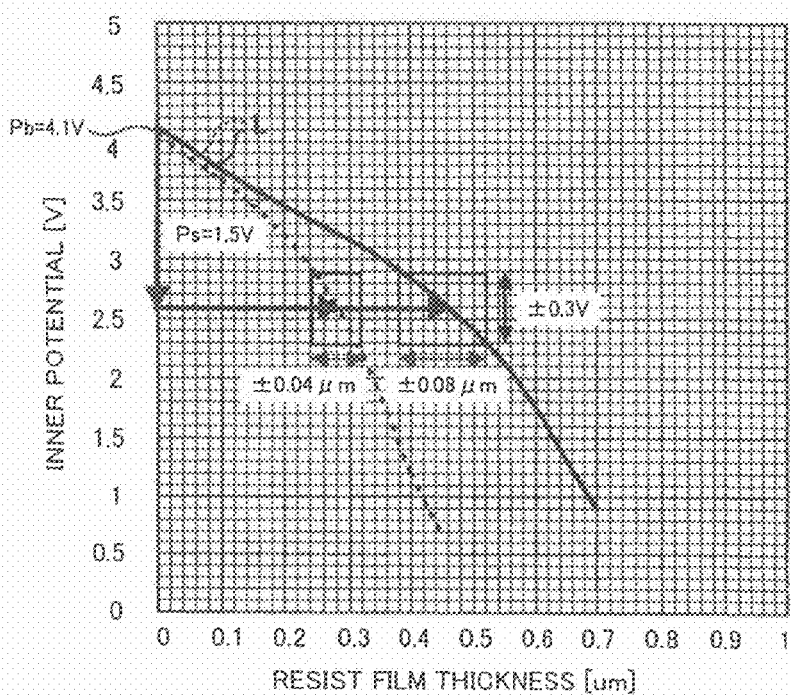
FIG. 9 is a graph illustrating a first relationship between the film thickness of the residual resist film and an inner potential of an impurity layer formed by ion implantation via the residual resist films.

FIG. 9 is a graph illustrating a first relationship between the film thickness of the residual resist film 18 and the inner potential of the impurity layer 13. A dotted line in the figure is a graph for the case where the ion implantation is performed with an acceleration voltage of 320 kV. A solid line in the figure is a graph for the case where the ion implantation is performed with an acceleration voltage of 520 kV.

As shown in FIG. 9, the inner potential decreases as the film thickness of the residual resist film 18 increases regardless of the acceleration voltage. However, due to difference of the acceleration voltage, a rate of decrease of the inner potential (hereinafter referred to as slope of the graph) is different in some part according to the increase of the film thickness of the residual resist film 18. This phenomenon is found by the inventors of the present application.

For example, when ion implantation is performed with the acceleration voltage of 320 kV, the slope of the graph is constant within a range of the film thickness from 0 to 0.14 μm. The absolute value of the slope of the graph increases with the increase of the film thickness of the residual resist film 18, when the film thickness becomes larger than 0.14 μm. The slope of the graph becomes zero, though it is not shown in the figure, when the film thickness of the residual resists film 18 further increases. This means that the implanted ions 20 no longer penetrate through the residual resist film 18.

In contrast, when ion implantation is performed with the acceleration voltage of 520 kV, the range of the film thickness where the slope of the graph is constant expands to a range of 0 to 0.42 μm. When the film thickness exceeds this range, the absolute value of the slope of the graph increases as the film thickness of the residual resist film 18 increases, and when the film thickness of the residual resist film 18 is further increased, the smallest film thickness at which the slope of the graph becomes zero increases.

Here, the range of the film thickness of the residual resist film 18 in which the slope of the graph is constant is defined as a linear region L, and the maximum value of the linear region L is defined as a linear limit. On the other hand, the smallest film thickness of the residual resist film 18 at which the slope of the graph becomes zero is defined as a penetration limit. Accordingly, it is understood from FIG. 9 that when the acceleration voltage increases, the linear region L expands and the linear limit increases. When the acceleration voltage increases, the penetration limit also increases, which is not shown in the figure.

Figure 10:
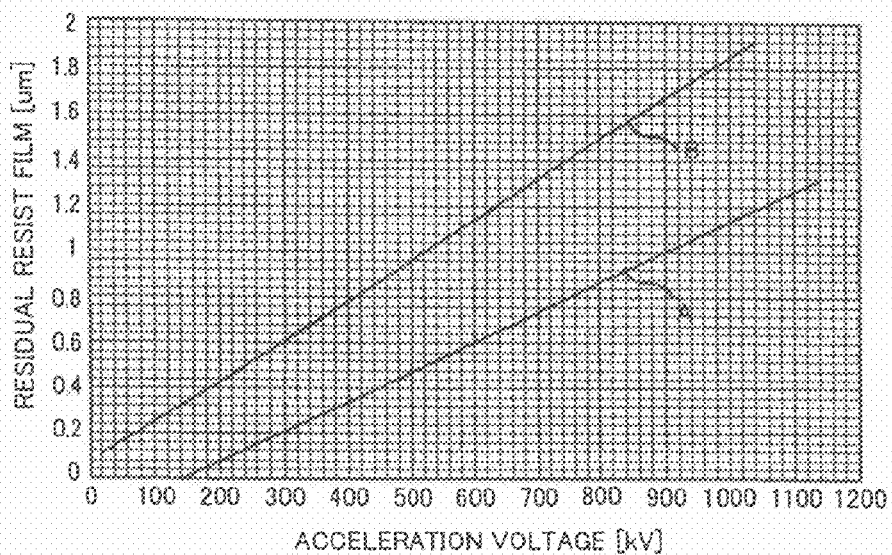
FIG. 10 is a graph illustrating a relationship between an ion acceleration voltage and a linear limit/a penetration limit.

FIG. 10 is a graph illustrating a relationship between the ion acceleration voltage of the ions 20 of the ion implantation device 19 and the linear limit/the penetration limit. In the figure, a line A represents the linear limit, and a line B represents the penetration limit. As shown in FIG. 10, the linear limit and the penetration limit increase in a linear manner as the acceleration voltage of the ions 20 increases. This phenomenon is also found by the inventors of the present application.

Now, FIG. 9 is referenced again. The method for deciding the acceleration voltage and the dose amount of the ion implantation device 19 and the method for deciding the film thickness of the residual resist film 18 are derived from FIG. 9. More specifically, first, a temporary acceleration voltage and a temporary dose amount of the device are determined so that the reference potential Pb becomes 4.1 V before the appropriate acceleration voltage and the appropriate dose amount are ultimately derived.

Figure 11:
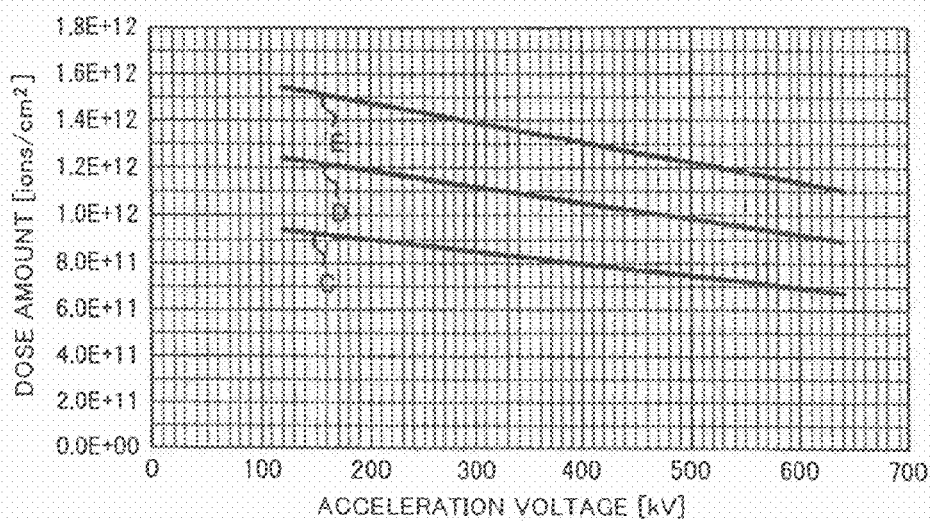
FIG. 11 is a graph illustrating a relationship between the acceleration voltage and the dose amount of ions required for obtaining a desired reference potential.

FIG. 11 is a graph illustrating a relationship between the acceleration voltage and the dose amount of ions required for obtaining the desired reference potential Pb. In FIG. 11, a line C represents a relationship therebetween that is needed to obtain a reference potential Pb of 2.5 V, a line D represents a relationship therebetween that is needed to obtain a reference potential Pb of 3.5V, and a line E represents relationship therebetween that is needed to obtain a reference potential Pb of 4.5 V.

The temporary acceleration voltage and the temporary dose amount may be determined on the basis of the relationships as shown in FIG. 11. In this case, the temporary acceleration voltage may be set at 320 kV, and the temporary dose amount may be set at such dose amount that the reference potential Pb becomes 4.1 V as referred to FIG. 11.

Subsequently, the film thickness of the residual resist film 18 that is needed to obtain the desired step potential Ps is determined. As can be seen from the dotted line of FIG. 9, the temporary film thickness of the residual resist film 18 that is needed to obtain a step potential Ps of 1.5 V is 0.28 μm.

However, when the temporary film thickness is thus set, the absolute value of the slope of the graph at this film thickness is large, and the permissible variation of the film thickness of the residual resist film 18 for satisfying the permissible margin ±0.3 V of the step potential Ps is ±0.04 μm. In contrast, as a result of actually forming the residual resist film 18, it is assumed that the variation of the film thickness of ±0.08 μm could not be avoided. In this case, the variation of the inner potential according to the variation of the actual film thickness cannot be brought within the permissible margin. That is, when ion implantation is performed with the acceleration voltage and the dose amount of the ion implantation device 19 as described above, it is impossible to produce a product satisfying the required product characteristics.

In this case, the acceleration voltage of the ion implantation device 19 is increased on the basis of the phenomenon found by the inventors of the present application. More specifically, the acceleration voltage of the ion implantation device 19 is set so that the variation of the inner potential according to the variation of the actual film thickness of the residual resist film 18 stays within the permissible margin of the step potential Ps. FIG. 9 shows that the acceleration voltage is, for example, 520 kV as shown by the solid line.

It should be noted that as the acceleration voltage increases, the reference potential Pb increases. Accordingly, the dose amount is reduced in order to obtain the reference potential (=4.1V). Therefore, the acceleration voltage and the dose amount of the ion implantation device 19 are determined.

As described above, after the acceleration voltage and the dose amount are determined, the actual film thickness of the residual resist film 18 is determined. The solid line of FIG. 9 indicates that the actual film thickness of the residual resist film 18 that is needed to obtain the step potential Ps of 1.5 V is 0.46 μm.

When the film thickness is thus set, the absolute value of the slope of the graph at this film thickness is less than the absolute value of the slope of the graph at the temporary film thickness, and the permissible variation of the film thickness of the residual resist film 18 for satisfying the permissible margin ±0.3 V of the step potential Ps is expanded up to ±0.08 μm, which is equivalent to the variation of the actual film thickness of the residual resist film 18. Therefore, the variation of the inner potential according to the variation of the actual film thickness can be brought within the permissible margin. In other words, when the ion implantation is performed with the acceleration voltage and the dose amount of the ion implantation device 19 as described above, a product satisfying the required product characteristics can be produced.

Subsequently, the method for deciding the film thickness of the residual resist film 18 and the acceleration voltage and the dose amount of the ion implantation device 19 for forming a product having product characteristics different from that of the product described above will be explained.

First, a case will be explained in which a product is formed with product characteristics having a reference potential Pb of 3.4 V and a step potential Ps of 1.5 V. It should be noted that the permissible margin of the step potential Ps for this product is ±0.3 V.

Figure 12:
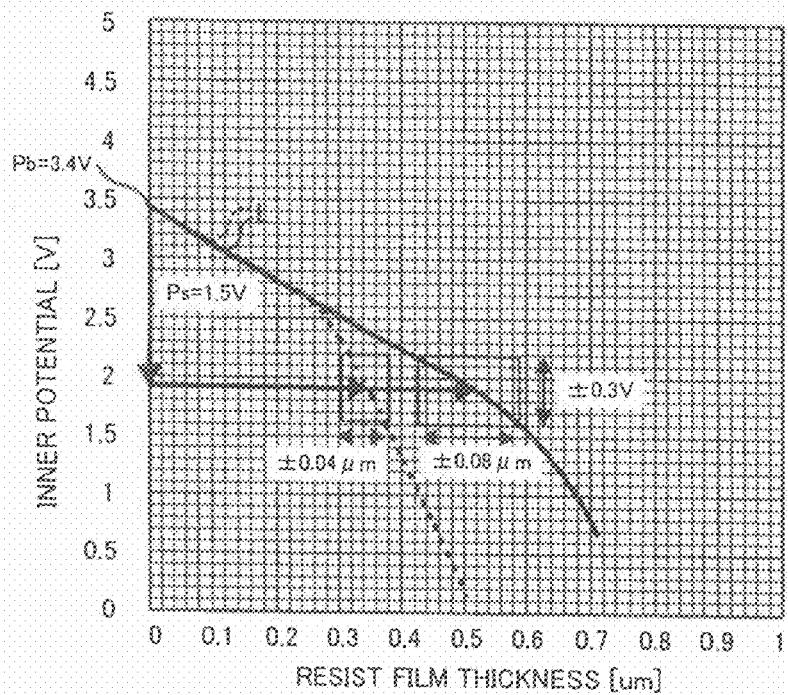
FIG. 12 is a graph illustrating a second relationship between the film thickness of the residual resist film and the inner potential of an impurity layer formed by ion implantation via the residual resist films.

FIG. 12 is a graph illustrating a relationship between the film thickness of the residual resist film 18 and the inner potential of an impurity layer 13. A dotted line in the figure is a graph of ion implantation with an acceleration voltage of 320 kV. A solid line in the figure is a graph of ion implantation with an acceleration voltage of 520 kV.

As is apparent from FIG. 12, when the ions 20 are implanted with an acceleration voltage of 320 kV, the slope of the graph at the film thickness of the residual resist film 18 required for obtaining the step potential Ps (=1.5 V) is steep as indicated by the dotted line in the figure, and the permissible variation of the film thickness of the residual resist film 18 for satisfying the permissible margin ±0.3 V of the step potential Ps is ±0.04 μm. In contrast, as a result of actually forming the residual resist film 18, it is assumed that the variation of the film thickness of +0.08 μm could not be avoided. In this case, the variation of the inner potential based on the variation of the actual film thickness cannot be brought within the permissible margin.

However, when the acceleration voltage is increased to 520 kV, the slope of the graph at the film thickness of the residual resist film 18 required for obtaining the step potential Ps (=1.5 V) is not steep as indicated by the solid line in the figure, and the permissible variation of the film thickness of the residual resist film 18 for satisfying the permissible margin ±0.3 V of the step potential Ps is ±0.08 μm, which is equivalent to the variation of the actual film thickness of the residual resist film 18. Therefore, the variation of the inner potential according to the variation of the actual film thickness can be brought within the permissible margin. In other words, when the ion implantation is performed with the acceleration voltage and the dose amount of the ion implantation device 19 as described above, a product satisfying the required product characteristics can be produced.

Subsequently, a case will be explained in which a product is formed with product characteristics having a reference potential Pb of 2.5 V and a step potential Ps of 1.0 V. It should be noted that the permissible margin of the step potential Ps for this product is ±0.3 V.

Figure 13:
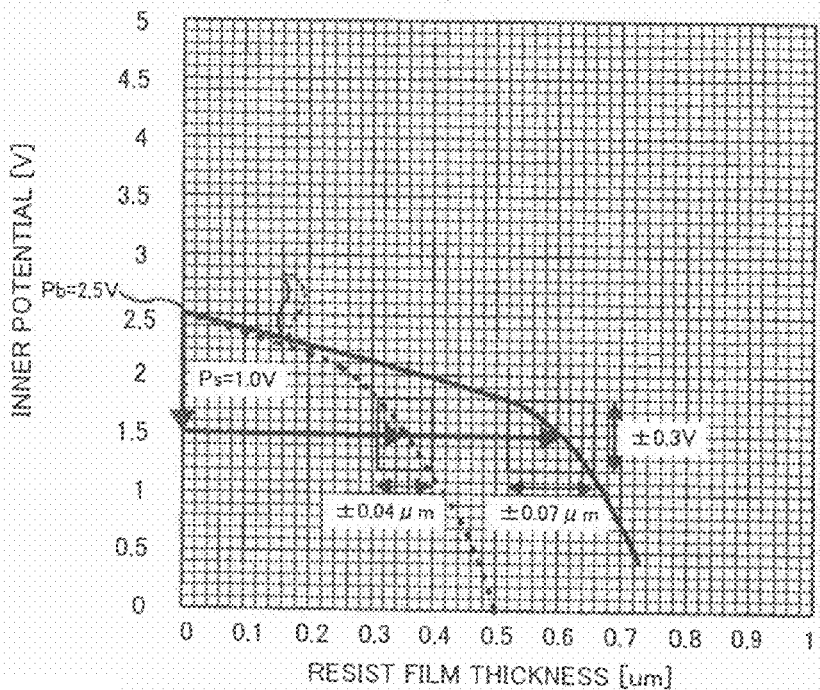
FIG. 13 is a graph illustrating a third relationship between the film thickness of the residual resist film and the inner potential of an impurity layer formed by ion implantation via the residual resist films.

FIG. 13 is a graph illustrating a relationship between the film thickness of the residual resist film 18 and the inner potential of the impurity layer 13. A dotted line in the figure is a graph of ion implantation with an acceleration voltage of 320 kV. A solid line in the figure is a graph of ion implantation with an acceleration voltage of 520 kV.

As is apparent from FIG. 13, when the ions 20 are implanted with an acceleration voltage of 320 kV, the slope of the graph at the film thickness of the residual resist film 18 required for obtaining the step potential Ps (=1.0 V) is steep as indicated by the dotted line in the figure, and the permissible variation of the film thickness of the residual resist film 18 for satisfying the permissible margin ±0.3 V of the step potential Ps is ±0.04 μm. In contrast, as a result of actually forming the residual resist film 18, it is assumed that the variation of the film thickness of ±0.07 μm could not be avoided. In this case, the variation of the inner potential according to the variation of the actual film thickness cannot be brought within the permissible margin.

However, when the acceleration voltage is increased to 520 kV, the slope of the graph at the film thickness of the residual resist film 18 required for obtaining the step potential Ps (=1.0 V) is not steep as indicated by the solid line in the figure, and the permissible variation of the film thickness of the residual resist film 18 for satisfying the permissible margin ±0.3 V of the step potential Ps is ±0.07 μm, which is equivalent to the variation of the actual film thickness of the residual resist film 18. Therefore, the variation of the inner potential according to the variation of the actual film thickness can be brought within the permissible margin. In other words, when the ion implantation is performed with the acceleration voltage and the dose amount of the ion implantation device 19 as described above, a product satisfying the required product characteristics can be produced.

The acceleration voltage and the dose amount of the ion implantation device 19 and the film thickness of the residual resist film 18 are derived as described above.

According to the manufacturing method of the solid-state image pickup device according to the present embodiment as described above, impurity layers 13 are formed by setting the acceleration voltage and the dose amount of the ion implantation device 19 so that the variation of the step potential Ps caused by the variation of the film thickness of the residual resist film 18 stays within the permissible range. Therefore, even when the film thicknesses of the residual resist films 18 vary, the solid-state image pickup device satisfying the product characteristics can be formed.

The transfer efficiency of charges in the horizontal transfer register produced according to such method is 90% or more. As compared with the conventional transfer efficiency of 40% to 60%, the deterioration of the transfer efficiency can be prevented, and the transfer efficiency is greatly improved.

The embodiment of the present invention has been hereinabove explained. However, this embodiment is presented as an example, and is not intended to limit the scope of the invention. These new embodiments can be embodied in various other forms, and various kinds of omissions, replacements, and changes can be made without deviating from the gist of the invention. These embodiments and the modifications thereof are included in the scope and the gist of the invention, and are included in the invention described in the claims and the scope equivalent thereto.

For example, in the above explanation, the manufacturing method of the horizontal transfer register of the CCD transfer register in which the conductivity type of the impurity layer 13 is N-type has been explained. Alternatively, the manufacturing method of the solid-state image pickup device according to the present embodiment may be applied to a manufacturing method of a vertical transfer register.

Still alternatively, the method for manufacturing a solid-state image pickup device according to the present embodiment may be applied to a method for manufacturing a horizontal transfer register of a CCD transfer register in which the conductivity type of an impurity layer 13 is P-type. In this case, FIGS. 9, 12 and 13 are modified to graphs, which are horizontally reversed with the same horizontal and vertical axes. FIGS. 10 and 11 become graphs in which the slopes are negative.

Further, the method for manufacturing a solid-state image pickup device according to the present embodiment may be applied to a method for manufacturing a CMOS transfer register. In these solid-state image pickup devices, the conductivity type of each layer is not limited.

As described above, the manufacturing method of the solid-state image pickup device according to the present embodiment can be applied to any method for manufacturing a semiconductor device as long as it includes a step of forming an impurity layer formed with a potential gradually getting deeper toward a transfer direction of charges.

The resist layer 16 applied in the above embodiment is a negative-type resist layer. Alternatively, a positive resist layer may be employed as a resist layer. The grating mask 17 applied in the above embodiment with a reversed transmittance may be used as a grating mask for this case.

The resist layer 16 may be made of a material whose dissolution shows a minor change with respect to an etching liquid. This prevents the film thickness of the resist film 18 from varying, and therefore, the deterioration of the transfer efficiency is reduced, and the transfer efficiency is greatly improved.

In place of the grating mask described in the above embodiment, a grating mask may be employed in which another transmission region is formed in a portion between a transmission region and a non-transmission region enclosing the transmission region, wherein another transmission region has a transmittance substantially between these transmittances of these regions. This prevents formation of a dip on the resist film 18, and therefore, the deterioration of the transfer efficiency is further reduced, and the transfer efficiency is greatly improved.

What is claimed is:

1. A method for manufacturing a semiconductor device, comprising the steps of:
    forming a resist layer having a uniform film thickness on a semiconductor substrate;
    exposing the resist layer using an exposure mask having a plurality of transmission regions whose transmittances change toward a transfer direction of charges;
    developing the exposed resist layer and thereby forming a plurality of residual resist films whose film thicknesses change according to the transmittances of the exposure mask; and
    forming, within the semiconductor substrate, a plurality of impurity layers having an inner potential including a predetermined reference potential and a predetermined step potential by implanting ions using an ion implantation device into the semiconductor substrate through the residual resist films,
wherein an acceleration voltage and a dose amount of the ion implantation device are determined so that an error of the inner potential caused by an error of the film thicknesses of the residual resist films stays within a permissible range.

2. The method for manufacturing the semiconductor device according to claim 1, wherein the acceleration voltage and the dose amount of the ion implantation device are determined on the basis of relationship between the film thickness of the residual resist film and the inner potential of the impurity layer.

3. The method for manufacturing the semiconductor device according to claim 2, wherein the acceleration voltage and the dose amount of the ion implantation device are determined on the basis of values of the reference potential and the step potential constituting the inner potential required for the semiconductor device to be produced.

4. The method for manufacturing the semiconductor device according to claim 3, wherein the acceleration voltage of the ion implantation device is adjusted so that a linear limit in a graph representing change of the acceleration voltage with respect to change of the film thickness of the residual resist film attains a predetermined value.

5. The method for manufacturing the semiconductor device according to claim 4, wherein the predetermined value in the linear limit is determined so that variation of the film thickness of the residual resist film stays within variation of the step potential constituting the inner potential required for the semiconductor device to be produced.

6. The method for manufacturing the semiconductor device according to claim 1, wherein the step of exposing the resist layer is a step for exposing the resist layer using an exposure mask in which the pluralities of transmission regions are arranged in rows spaced apart from each other, and
the step of forming the residual resist films is a step of arranging and forming the pluralities of residual resist films in rows spaced apart from each other by developing the exposed resist layer.

7. The method for manufacturing the semiconductor device according to claim 6, wherein the resist layer may be made of a material whose dissolution shows a minor change with respect to an etching liquid.

8. The method for manufacturing the semiconductor device according to claim 7 further comprising a step of forming an electrode on the impurity layer after the step of forming the impurity layer.

9. The method for manufacturing the semiconductor device according to claim 5, wherein the step of exposing the resist layer is a step for exposing the resist layer using an exposure mask in which the pluralities of transmission regions are arranged in rows spaced apart from each other, and
the step of forming the residual resist films is a step of arranging and forming the pluralities of residual resist films in rows spaced apart from each other by developing the exposed resist layer.

10. The method for manufacturing the semiconductor device according to claim 9, wherein the resist layer may be made of a material whose dissolution shows a minor change with respect to an etching liquid.

11. The method for manufacturing the semiconductor device according to claim 10 further comprising a step of forming an electrode on the impurity layer after the step of forming the impurity layer.

12. The method for manufacturing the semiconductor device according to claim 11, wherein the exposure mask is a grating mask.

13. The method for manufacturing the semiconductor device according to claim 5, wherein the semiconductor device to be produced is a solid-state image pickup device.

14. The method for manufacturing the semiconductor device according to claim 13, wherein the semiconductor device to be produced is a transfer register of the solid-state image pickup device.

15. The method for manufacturing the semiconductor device according to claim 14, wherein the inner potential has a profile getting deeper toward the transfer direction of charges.

16. The method for manufacturing the semiconductor device according to claim 15, wherein the exposure mask is a grating mask.

* * * * *